United States Patent
Itou

(10) Patent No.: US 7,879,533 B2
(45) Date of Patent: Feb. 1, 2011

(54) ETCHING RESIDUE REMOVAL METHOD AND SEMICONDUCTOR DEVICE FABRICATION METHOD USING THIS METHOD

(75) Inventor: Takeshi Itou, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1187 days.

(21) Appl. No.: 11/429,217

(22) Filed: May 8, 2006

(65) Prior Publication Data

US 2006/0254617 A1    Nov. 16, 2006

(30) Foreign Application Priority Data

May 13, 2005  (JP)  .............................. 2005-140591

(51) Int. Cl.
*H01L 21/00*    (2006.01)
(52) U.S. Cl. .................. 430/317; 430/318; 216/77; 216/78; 134/1.3; 134/26; 134/94.1
(58) Field of Classification Search .................. 430/317, 430/318; 134/26, 94.1, 1.3; 216/77, 78
See application file for complete search history.

(56) References Cited

U.S. PATENT DOCUMENTS

2003/0119331 A1 * 6/2003 Muranaka .................. 438/748

2004/0147420 A1 * 7/2004 Zhou et al. .................. 510/176

FOREIGN PATENT DOCUMENTS

JP    2002-158206    5/2002

* cited by examiner

*Primary Examiner*—Thorl Chea
(74) *Attorney, Agent, or Firm*—Volentine & Whitt, P.L.L.C.

(57) ABSTRACT

An etching residue removal method includes a cleaning sequence. Preferably, the cleaning sequence has a first washing processing, first drying processing, stripper processing, rinsing processing, second washing processing and second drying processing. In the first washing processing, an insulation film and metal lines thereon are washed by pure water. In the first drying processing, the insulation film and metal lines are dried in a nitrogen atmosphere at room temperature, for example. In the stripper processing, the etching residue on the insulation film and metal lines are stripped by amine stripper, for example. In the rinsing processing, the insulation film and metal lines are rinsed with an IPA rinse solution, for example. In the second washing processing, the insulation film and metal lines are washed with pure water. In the second drying processing, the insulation film and metal lines are dried in the nitrogen atmosphere at room temperature, for example.

20 Claims, 5 Drawing Sheets

ETCHING RESIDUE REMOVAL METHOD OF FIG. 1 →

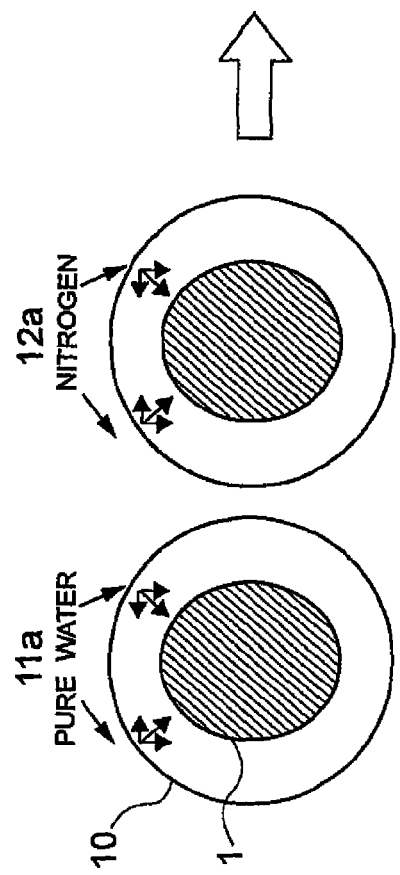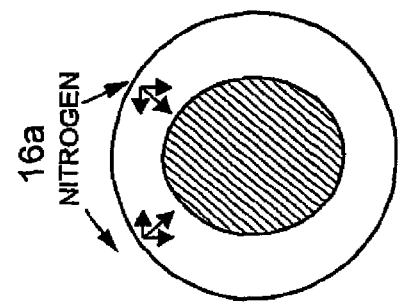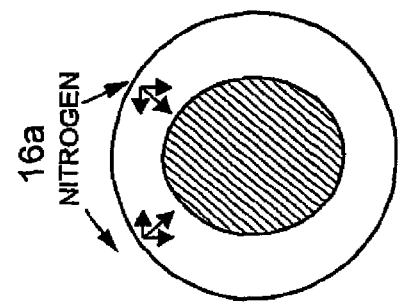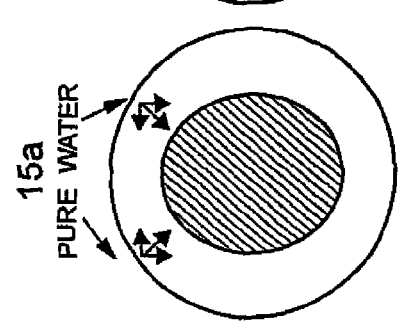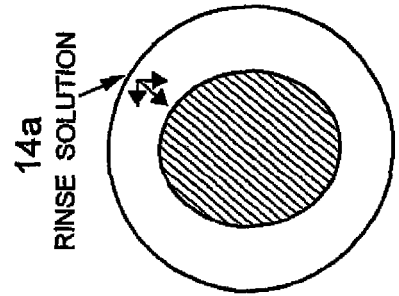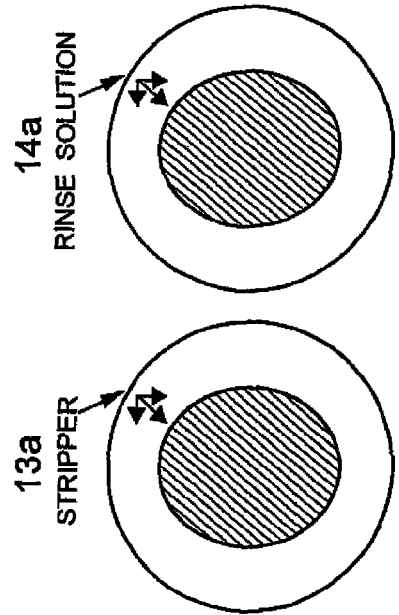
FIG. 3A (1) WASHING PROCESSING 11
FIG. 3B (2) DRYING PROCESSING 12
FIG. 3C (3) STRIPPER PROCESSING 13
FIG. 3D (4) RINSING PROCESSING 14
FIG. 3E (5) WASHING PROCESSING 15
FIG. 3F (6) DRYING PROCESSING 16

FIG. 4

| DELIVERY AMOUNT | | | 15L / MIN | 6L / MIN | | | TOTAL |
|---|---|---|---|---|---|---|---|
| CONVENTIONAL METHOD | | | STRIPPER PROCESSING | RINSING PROCESSING | WASHING PROCESSING | DRYING PROCESSING | 22 MIN 40 SEC (32 MIN 40 SEC) |
| PROCESSING TIME | WASHING PROCESSING | DRYING PROCESSING | 15 MIN (25 MIN) | 10 SEC | 4 MIN 30 SEC | 3 MIN | |
| AMOUNT TO BE USED | 1 MIN | 3 MIN | 375L | 1L | | | STRIPPER 375L |
| EMBODIMENT 1 METHOD | | | STRIPPER PROCESSING | RINSING PROCESSING | WASHING PROCESSING | DRYING PROCESSING | 26 MIN. 40 SEC |
| PROCESSING TIME | | | 15 MIN | 10 SEC | 4 MIN 30 SEC | 3 MIN | |
| AMOUNT TO BE USED | | | 225L | 1L | | | STRIPPER 225L |

ETCHING RESIDUE REMOVAL METHOD AND SEMICONDUCTOR DEVICE FABRICATION METHOD USING THIS METHOD

BACKGROUND OF THE INVENTION

1. Field of the Invention

The present invention relates to a method for removing etching residue remaining after metal lines are formed by etching a metal film using a resist pattern as a mask, and the unnecessary resist patterns are removed in the metallization step of a semiconductor fabrication method. The present invention also relates to a semiconductor device fabrication method using this etching residue removal method.

2. Description of the Related Art

In the metallization step in the semiconductor device fabrication method, a metal film (e.g., aluminum film) is formed on a substrate via an insulation film, the resist film is coated thereon, and a resist pattern is formed by patterning the resist film by a photolithography technology. Then, metal lines are formed by metal-etching the metal film based on plasma dry etching using this resist pattern as a mask, and unnecessary resist patterns are removed (stripped) by ashing.

One method to remove unnecessary resist patterns when metal etching ends relies upon a stripper, such as thermal organic acid, and another method relies upon ashing.

The resist-pattern-removal method which uses ashing is easier than the resist-pattern-removal method which uses a stripper, but if the amount of impurities, such as metal, in the resist pattern is high, an etching residue remains even after resist patterns are removed, and this often adversely affects the semiconductor elements. Therefore etching residue is removed by performing a cleaning sequence after metal etching. In other words, the etching residue is removed by employing the etching residue removal method.

The conventional etching residue removal method includes a series of processing: a stripper processing for stripping the etching residue by an amine stripper (e.g., mixed solution of hydroxylamine and catechol: product name "SST-3"), a rinsing processing for rinsing the insulation film and metal lines thereon by a rinse solution (e.g., isopropyl alcohol of which a constituent is 2-propanol, hereafter called "IPA"), a washing processing for washing the insulation film and metal lines thereon by pure water, and a drying processing for drying the insulation film and the metal lines thereon.

One example of the conventional etching residue removal method is shown in FIG. 4 of the accompanying drawings. L stands for liter(s), MIN stands for minute(s) and SEC stands for second(s) in FIG. 4.

Device used: a batch spray device having a spray nozzle that sprays stripper etc. This device alone can perform stripper processing, rinsing processing, washing processing and drying processing for a plurality of wafers.

Stripper processing: delivery amount of the stripper from the spray nozzle is 15 liters/minute, 375 liters of amine stripper (product name is SST-3) is used, processing time is 15 minutes.

Rinsing processing: delivery amount of the rinse solution is 6 liters/minute, one litter of rinse solution (IPA) is used, processing time is 10 seconds.

Washing processing: pure water is used, processing time is 4 minutes and 30 seconds.

Drying processing: processing time is 3 minutes.

Total processing time: 22 minutes and 40 seconds.

Another conventional etching residue removal method related to this method is disclosed in FIG. 8 of Japanese Patent Application Kokai (Laid-Open) No. 2002-158206. The etching residue removal method of this JP 2002-158206 A1 performs a cleaning sequence at least twice. The cleaning sequence includes the stripper processing for stripping the etching residue on the substrate by fluorine stripper, rinsing processing for rinsing the substrate with a rinse solution (mixed solution of IPA and water), washing processing for washing the substrate, and drying processing for drying the substrate. This cleaning sequence is continuously repeated at least twice.

An example of the etching residue removal method of JP 2002-158206 A1 is described below.

Device used: dip device to soak a substrate into a processing bath, or a spray device. This device alone can perform stripper processing, rinsing processing and washing processing. For drying processing, a dryer device is used.

Stripper processing: fluorine stripper (ammonium fluoride) is used, processing time is 3 minutes and 20 seconds.

Rinsing processing: rinse solution is a mixed solution of IPA and water (volume ratio 4:1), processing time is 2 minutes and 20 seconds.

Washing processing: pure water is used, processing time is 2 minutes and 20 seconds.

Drying processing: temperature is 23° C., dried in a nitrogen atmosphere, processing time is 7 minutes and 15 seconds.

Time for one cleaning sequence: 15 minutes and 15 seconds.

Total processing time: if performed twice, processing time is 30 minutes and 30 seconds (=15 minutes and 15 seconds×2).

SUMMARY OF THE INVENTION

The conventional etching residue removal methods, and the semiconductor device fabrication methods using the conventional etching residue removal methods have the following problems.

(A) The Etching Residue Removal Method of FIG. 4

Since KrF is used for the resist (i.e., resist selectively decreases) and the interconnect pitch becomes finer, the deposition gas (such gas as Bc13 and C12, which is essential to form metal lines) tends to be used for metal etching. If the deposition gas is used, the stripping ability of the deposition residue (composite matter of etching gas, resist and etched film) after etching drops. Therefore the present inventor increased the stripper processing time (e.g., from 15 minutes to 25 minutes) as shown in FIG. 4 to prevent the generation of an interconnect short due to the remaining residue and to improve the stripping ability. However increasing the stripper processing time increases the total processing time of the cleaning sequence (e.g., from 22 minutes and 40 seconds to 32 minutes and 40 seconds), and the productivity drops.

(B) The Etching Residue Removal of JP 2002-158206 A1

Because the cleaning sequence is repeated continuously twice or more, the total processing time becomes long (e.g., 30 minutes and 30 seconds or more) and the productivity drops. Also the use of fluorine stripper damages the metal lines.

One object of the present invention is to provide a technically satisfying etching residue removal method.

Another object of the present invention is to provide a technically satisfying semiconductor device fabrication method.

According to a first aspect of the present invention, there is provided an etching residue removal method that removes the etching residue remaining after removing resist patterns from metal lines formed on an insulation film. The etching residue removal method includes a first washing processing for washing the insulation film and the metal lines. The etching residue removal method also includes a first drying processing for drying the insulation film and the metal lines. The etching residue removal method also includes a stripper processing for stripping the etching residue from the insulation film and the metal lines by stripper. The etching residue removal method also includes a rinsing processing for rinsing the insulation film and the metal lines with rinse solution. The etching residue removal method also includes a second washing processing for washing the insulation film and the metal lines. The etching residue removal method also includes a second drying processing for drying the insulation film and the metal lines.

In the first washing processing, the insulation film and the metal lines thereon may be washed with pure water. In the first drying processing, the insulation film and the metal lines may be dried in a nitrogen atmosphere at a room temperature. In the stripper processing, the etching residue attached to the insulation film and metal lines may be stripped by amine stripper. In the rinsing processing, the insulation film and the metal lines may be rinsed with an IPA rinse solution. In the second washing processing, the insulation film and the metal lines may be washed with pure water. In the second drying processing, the insulation film and the metal lines may be dried in the nitrogen atmosphere at the room temperature.

In the present invention, the first washing processing is performed before the stripper processing. Thus, the etching residue swells, and is more easily stripped in the subsequent stripper processing. By performing the stripper processing, rinsing processing, second washing processing and second drying processing after the first washing processing, the capability of stripping etching residue can be improved. Also the stripper processing time can be decreased because of the improvement of the stripping capability, so that the processing time of the cleaning sequence can be decreased, and the amount of stripper to be used can be decreased. If the first drying processing is performed after the first washing processing, damage on the metal lines, caused otherwise when water and stripper are mixed in the subsequent stripper processing, can be prevented.

If amine stripper is used as the stripper, damage on the metal is minor. Thus, a synergetic effect of use of the amine stripper with the first drying processing further decreases the damage on the metal.

According to a second aspect of the present invention, there is provided a fabrication method for a semiconductor device. The fabrication method includes forming an insulation film on a substrate, and forming a metal film on the insulation film. The fabrication method also includes forming a resist film on the metal film, and forming a resist pattern by patterning the resist film. The fabrication method also includes forming metal lines by etching the metal film using the resist pattern as a mask. The fabrication method also includes removing the resist pattern. The fabrication method also includes cleaning the etching residue remaining after the resist pattern is removed. This cleaning is performed using the above described etching residue removal method.

According to a third aspect of the present invention, there is provided an apparatus for removing etching residue remaining after removing a resist pattern on a metal line formed on an insulation film. The apparatus includes a sweller for swelling the etching residue on the insulation film and metal line, and a first drier for drying the insulation film and metal line. The apparatus also includes a stripper for stripping the etching residue from the insulation film and metal line. The apparatus also includes a rinsing unit for rinsing the insulation film and metal line. The apparatus also includes a washer for washing the insulation film and metal line, and a second drier for drying the insulation film and metal line.

These and other objects, aspects and advantages of the present invention will become apparent from the following detailed description and appended claims when read and understood in conjunction with the accompanying drawings.

BRIEF DESCRIPTION OF THE DRAWINGS

FIG. 3A to FIG. 3F depict a series of drawings which correspond to the six processing steps in FIG. 1, respectively;

FIG. 4 is a table showing the comparison of a conventional method and the etching residue removal method of Embodiment 1.

DETAILED DESCRIPTION OF THE INVENTION

Embodiment 1

First, a metallization process in the semiconductor device fabrication method according to a first embodiment of the present invention will be described with reference to FIG. 2A to FIG. 2F.

Figure 2A:
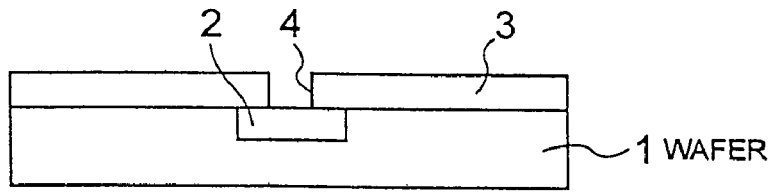
FIG. 2A to FIG. 2F show a series of metallization steps in the semiconductor device fabrication method.

In FIG. 2A, when many semiconductor elements are formed on a wafer 1, such as a silicon substrate, a mask for etching (not shown) is formed on the wafer 1, impurity ions are implanted through an opening of the mask to form an impurity diffusion layer, and many element formation areas 2 for the semiconductor elements are formed. After removing the etching mask, the inter-layer insulation film 3, made of $SiO_2$, is formed on the wafer 1 by a chemical vapor deposition (CVD) method. Then, the opening for connection 4 is formed in the inter-layer insulation film 3 on the element formation area 2 by photolithography.

Figure 2B:
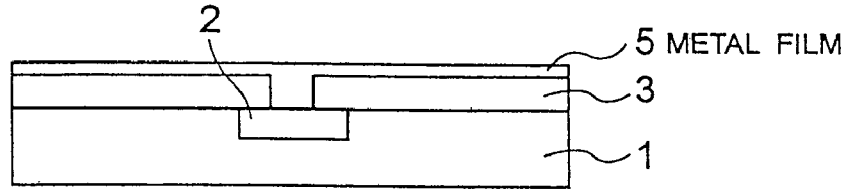

Then, the process of FIG. 2B is performed. In FIG. 2B, the metal film 5, made of aluminum, is formed on the entire surface of the inter-layer insulation film 3 by a CVD method. The opening 4 is also filled with the metal film 5. The metal film 5 is electrically connected to the element formation area 2 via the opening 4.

Figure 2C:
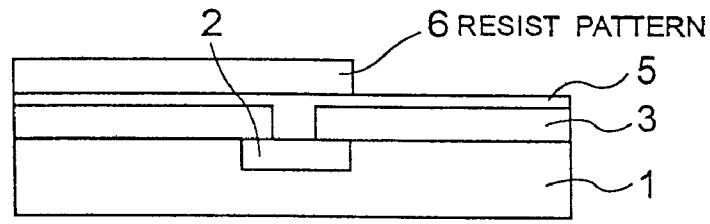

Then, the process of FIG. 2C is performed. In FIG. 2C, a resist film is coated on the entire face of the metal film 5, and the resist film is patterned by a photolithography technology to form the resist pattern 6.

Figure 2D:
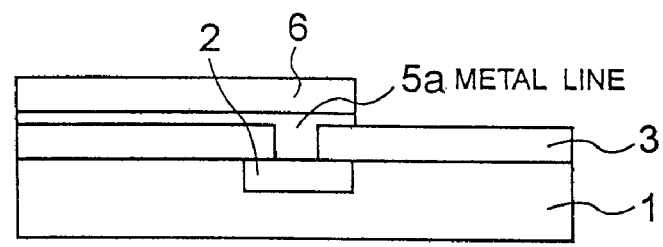

Then, the process of FIG. 2D is performed. In FIG. 2D, the metal film 5 is etched using the resist pattern 6 as a mask by plasma dry etching using a deposition type gas, such as Bc13 and C12, and the metal lines 5a in a predetermined pattern are formed.

Figure 1:
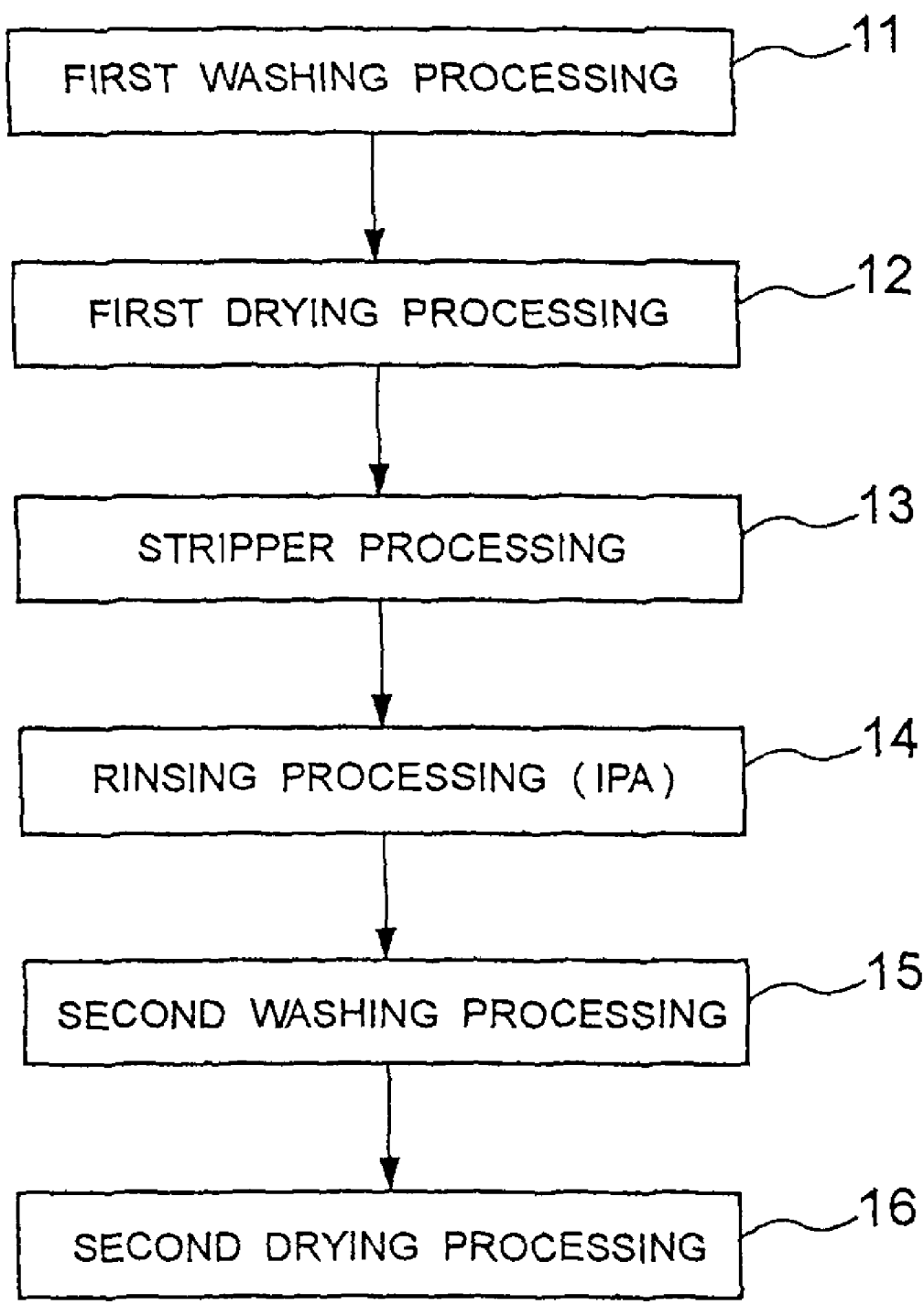
FIG. 1 is a flow chart depicting the cleaning sequence of an etching residue removal method according to Embodiment 1 of the present invention.
Figure 2E:
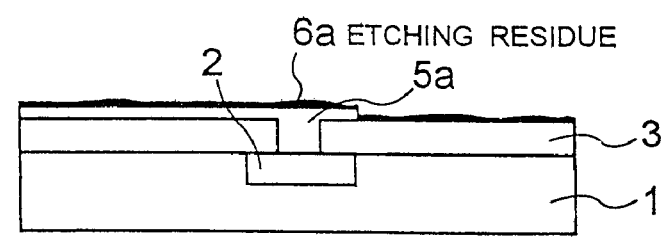

Then, the process of FIG. 2E is performed. In FIG. 2E, unnecessary resist pattern 6 is removed by ashing. If the amount of impurities, such as metal, remaining in the resist pattern 6 is high, the etching residue 6a remains on the inter-layer insulation film 3 and the metal lines 5a even after the resist pattern is removed. This etching residue 6a is a composite film of etching gas, resist and etched film, and may cause a negative influence, such as a short circuit. Thus, the etching residue 6a is removed by the cleaning sequence of the etching residue removal method of FIG. 1.

Figure 2F:
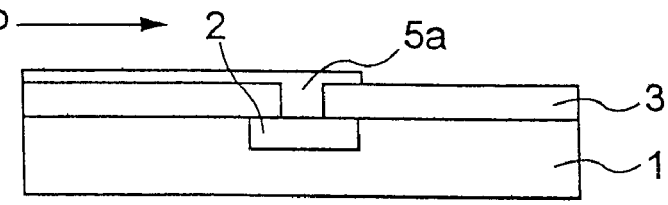

After the etching residue removal process of FIG. 1 is performed, the process of FIG. 2F is carried out. In FIG. 2F, electrodes (not shown) are formed on the metal lines 5a, and the entire surface is covered with the protective film, such as SiO2 film or SiN film, to complete the wafer processing. In the case of a multi-layer interconnect structure, a second layer of metal lines are formed via the inter-layer insulation film, the electrodes are formed thereon, and the entire surface is covered with the protective film to complete the wafer processing. When the wafer processing ends, electrical tests of elements are performed. Then, the element formation areas 2 are cut and many semiconductor chips are individualized to complete the fabrication process.

Now, the cleaning sequence of the etching residue removal method shown in FIG. 1 will be described in detail.

FIG. 1 is a flowchart depicting the cleaning sequence of the etching residue removal method according to Embodiment 1. FIG. 3A to FIG. 3F are diagrams depicting the six processing steps in FIG. 1, respectively.

In the etching residue removal method of Embodiment 1, (1) first washing processing 11 in FIG. 3A, (2) first drying processing 12 in FIG. 3B, (3) stripper processing 13 in FIG. 3C, (4) rinsing processing 14 in FIG. 3D, (5) second washing processing 15 in FIG. 3E, and (6) second drying processing 16 in FIG. 3F, are sequentially performed using a batch type spray device.

The batch type spray device can alone perform all of the washing processings 11 and 15, the drying processings 12 and 16, the stripper processing 13 and the rinsing processing 14 for a plurality of wafers 1. This spray device includes a processing chamber 10 for receiving (containing) the wafers 1, and a spray nozzle (not shown) attached to the processing chamber 10. The spray nozzle discharges (sprays) pure water 11a and 15a, nitrogen gas 12a and 16a, stripper (liquid) 13a or rinsing solution 14a into the processing chamber 10, depending upon the processing step in use. Thus, a plurality of wafers 1 are simultaneously processed. An exemplary cleaning sequence will be described with reference to FIG. 3A to FIG. 3F.

(1) First Washing Processing 11 (FIG. 3A)

A plurality of wafers 1 on which the metal lines 5a are formed as shown in FIG. 2E are placed in the processing chamber 10. Pure water 11a is sprayed from the spray nozzle to clean the surfaces of the wafers 1. The processing time is 1 minute.

(2) First Drying Processing 12 (FIG. 3B)

The inside temperature of the chamber 10 is kept at a room temperature. Nitrogen gas 12a is sprayed from the spray nozzle to dry the surfaces of the wafers. The processing time is 3 minutes.

(3) Stripper Processing 13 (FIG. 3C)

Amine stripper 13a is used. Its product name SST-3. The stripper 13a is sprayed from the spray nozzle to the surfaces of the wafers at the flow rate of 15 liters/minute, for stripping the etching residue 6a (FIG. 2E). The processing time is 15 minutes, and the amount of the stripper 13a to be used is 225 liters.

(4) Rinsing Processing 14 (FIG. 3D)

The rinse solution 14a is IPA. The rinse solution 14a is sprayed from the spray nozzle to the surfaces of the wafers for rinsing the wafers at the flow rate of 6 liters/minute. The processing time is 10 seconds, and the amount of rinse solution 14a to be used is 1 liter.

(5) Second Washing Processing 15 (FIG. 3E)

Pure water 15a is sprayed from the spray nozzle to the surface of the wafers to wash the rinse solution 14a off. The processing time is 4 minutes and 30 seconds.

(6) Second Drying Processing 16 (FIG. 3F)

The inside temperature of the chamber 10 is kept at the room temperature, and nitrogen gas 16a is sprayed from the spray nozzle to dry the surfaces of the wafers. The processing time is 3 minutes.

The cleaning sequence now completes. The total amount of stripper 13a to be used is 225 liters, and the total processing time is 26 minutes and 40 seconds.

Advantages of Embodiment 1 will be described with reference to FIG. 4.

FIG. 4 shows the comparison between the conventional method and the etching residue removal method of Embodiment 1. The etching residue removal method of Embodiment 1 has the following advantages (a) to (d) when compared with the conventional method.

(a) Because the first washing processing 11 is performed before the stripper processing 13, the etching residue 6a on the surface of the wafer swells and can be easily stripped in the subsequent stripper processing 13. Therefore the stripping capability of the etching residue 6a can be improved in the subsequent stripper processing 13, the rinsing processing 14, the second washing processing 15 and the second drying processing 16.

(b) Because of the improvement of the stripping capability, the stripper processing time can be decreased to 15 minutes. The conventional method requires 25 minutes. Thus, the processing time of the cleaning sequence can be decreased to 26 minutes and 40 seconds. The conventional method requires 32 minutes and 40 seconds. The amount of stripper to be used can also be decreased to 225 litters. The conventional method requires 375 liters.

(c) Because the first drying processing 12 is performed after the first washing processing 11, damage on the metal lines 5a (FIG. 2E), which would otherwise occur when water and the stripper 13a mix in the subsequent stripper processing 13, can be avoided.

(d) Amine stripper is used as the stripper 13a, so that damage on the metal lines 5a is minor. Use of the amine stripper and conducting of the first drying process 12 synergically function to further decrease the damage on the metal lines 5a.

Compared with another conventional method which is disclosed in Japanese Patent Application Kokai No. 2002-158206, the method of Embodiment 1 has the following advantages (e) and (f) in addition to an improvement in stripping capability, a decrease in the processing time, and a decrease in the amount of stripper to be used.

(e) The stripper processing and the rinsing processing steps are not performed at the beginning. Thus, the final etching residue 6a decreases and the stripping capability improves. This advantage will be described in detail with reference to FIG. 5.

(f) The rinse solution 14a is used only once. Thus, the amount of rinse solution to be used can be decreased.

It should be noted that Embodiment 1 uses a batch spray device, but a single wafer spray device, which processes wafers one by one, may be used. The single spray device sprays pure water, etc. from the spray nozzle to remove the etching residue while rotating the stage on which a wafer is mounted. Use of the single spray device, instead of the batch spray device, hardly influences the functions and advantages of Embodiment 1.

Evaluation results of Embodiment 1 obtained by experiments will be described with reference to FIG. 5.

Figure 5:
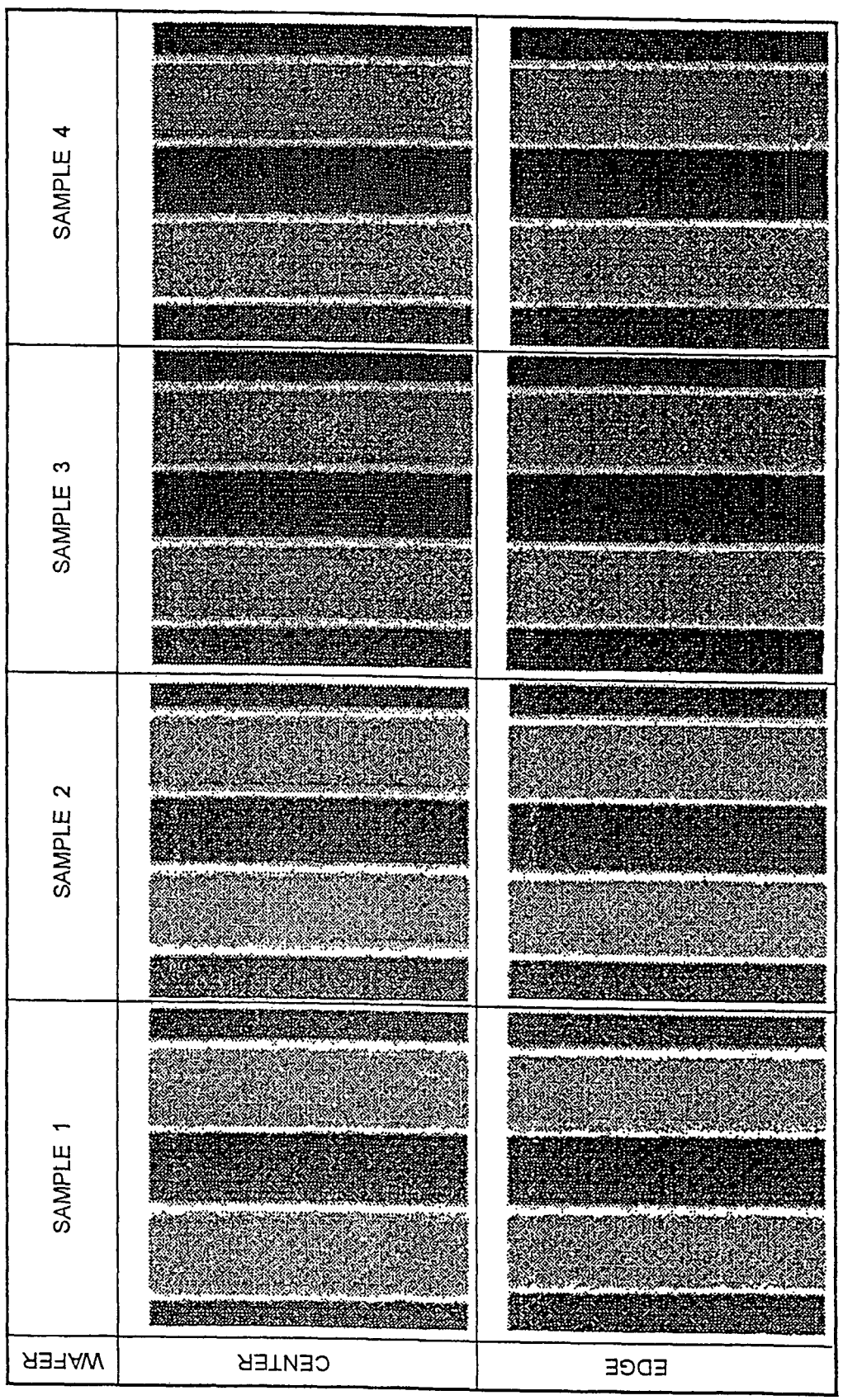
FIG. 5 is a table showing the evaluation of the stripping capability of Embodiment 1, as compared with other etching residue removal methods.

FIG. 5 shows the center and the edge of the surface of the wafer after the etching residue is removed. FIG. 5 indicates the evaluation results of the stripping capability improvement achieved by Embodiment 1 (sample 4), as compared with the conventional etching residue removal method shown in FIG. 4 (sample 1) and two other methods (samples 2 and 3).

Sample 1 underwent the conventional removal method of FIG. 4. Specifically, stripper processing 15 minutes→rinsing processing→washing processing→drying processing were performed on the sample 1 as shown in FIG. 4.

Sample 2 underwent a modified removal method. Specifically, the stripper processing time was reduced to the half, and the sequence was repeated twice (stripper processing 7 minutes and 30 seconds→rinsing processing→washing processing→drying processing→stripping processing 7 minutes and 30 seconds→rinsing processing→washing processing→drying processing).

Sample 3 underwent another modified method. Specifically, rinsing processing→washing processing→drying processing→stripper processing 15 minutes→rinsing processing→washing processing→drying processing were performed.

Sample 4 underwent the removal method of Embodiment 1. Specifically, washing processing→drying processing→stripper processing 15 minutes→rinsing processing→washing processing→drying processing were performed.

The samples 2 to 4 show the greater (or improved) stripping capability than the sample 1 because a certain treatment is carried out prior to the stripper processing. The sample 4 used a smaller amount of stripper than the sample 1. The improvement in the stripping capability was confirmed in the samples 2 to 4, when compared with the sample 1.

The stripper processing and the rinsing processing steps are not performed at the beginning in Embodiment 1 (sample 4). Thus, the final etching residue 6a can be decreased, and the stripping capability is improved in the sample 4 when compared with the conventional method disclosed in Japanese Patent Application Kokai No. 2002-158206.

It should be noted that the present invention is not limited to Embodiment 1, but can be modified in various ways. For example, the device, the materials, the processing time, the amount of the stripper, the amount of rinse solution, and the processing conditions used in Embodiment 1 can be changed to the optimum according to the film thickness and the constituents of the etching residue 6a, metal lines 5a, and the inter-layer insulation film 3. The present invention can be used not only for removing the etching residue remaining upon formation of the metal lines, but also for removing unnecessary resist which exist in other occasions during the semiconductor device fabrication method.

This application is based on Japanese Patent Application No. 2005-140591 filed on May 13, 2005 and the entire disclosure thereof is incorporated herein by reference.

What is claimed is:

1. A method for removing etching residue remaining after removing a resist pattern from a metal line formed on an insulation film, said method comprising:
    a first washing processing for washing said insulation film and said metal line;
    a first drying processing for drying said insulation film and said metal line;
    a stripper processing for stripping said etching residue from said insulation film and said metal line by a stripper;
    a rinsing processing for rinsing said insulation film and said metal line with rinse solution;
    a second washing processing for washing said insulation film and said metal line; and
    a second drying processing for drying said insulation film and said metal line.

2. The method for removing etching residue according to claim 1, wherein said stripper includes amine stripper.

3. The method for removing etching residue according to claim 1, wherein said rinse solution includes isopropyl alcohol.

4. The method for removing etching residue according to claim 1, wherein said first drying processing is performed in a nitrogen atmosphere at room temperature.

5. The method for removing etching residue according to claim 1, wherein said second drying processing is performed in a nitrogen atmosphere at room temperature.

6. The method for removing etching residue according to claim 1, wherein said first washing processing is performed with pure water.

7. The method for removing etching residue according to claim 1, wherein said second washing processing is performed with pure water.

8. A semiconductor device fabrication method comprising:
    forming an insulation film on a substrate;
    forming a metal film on said insulation film;
    forming a resist film on said metal film;
    forming a resist pattern by patterning said resist film;
    forming a metal line by etching said metal film using said resist pattern as a mask;
    removing said resist pattern; and
    removing etching residue remaining after said removing of said resist pattern, wherein said removing of said etching residue includes:
        a first washing processing for washing said insulation film and said metal line;
        a first drying processing for drying said insulation film and said metal line;
        a stripper processing for stripping said etching residue from said insulation film and said metal line by a stripper;
        a rinsing processing for rinsing said insulation film and said metal line with rinse solution;
        a second washing processing for washing said insulation film and said metal line; and
        a second drying processing for drying said insulation film and said metal line.

9. The semiconductor device fabrication method according to claim 8, wherein said stripper includes amine stripper.

10. The semiconductor device fabrication method according to claim 8, wherein said rinse solution includes isopropyl alcohol.

11. The semiconductor device fabrication method according to claim 8, wherein said first drying processing is performed in a nitrogen atmosphere at room temperature.

12. The semiconductor device fabrication method according to claim 8, wherein said second drying processing is performed in a nitrogen atmosphere at room temperature.

13. The semiconductor device fabrication method according to claim 8, wherein said first washing processing is performed with pure water.

14. The semiconductor device fabrication method according to claim 8, wherein said second washing processing is performed with pure water.

15. The semiconductor device fabrication method according to claim 8, wherein said removing of said resist pattern is performed by an ashing process.

16. The semiconductor device fabrication method according to claim 8 further comprising, after said removing of said etching residue, forming an electrode on the metal wire and forming a protective film over the metal wire.

17. A method for removing etching residue remaining after removing a resist pattern from a metal line formed on an insulation film, said method comprising:
- a first washing processing for washing said insulation film and said metal line;
- a first drying processing for drying said insulation film and said metal line;
- a stripper processing for stripping said etching residue from said insulation film and said metal line by a stripper;
- a rinsing processing for rinsing said insulation film and said metal line with rinse solution;
- a second washing processing for washing said insulation film and said metal line; and
- a second drying processing for drying said insulation film and said metal line,
- wherein said first washing processing and said first drying processing occur before said stripper processing.

18. The method for removing etching residue according to claim 17, wherein said first washing processing is performed with pure water.

19. The method for removing etching residue according to claim 18, wherein said stripper includes amine stripper.

20. The method for removing etching residue according to claim 18, wherein said rinse solution includes isopropyl alcohol.

* * * * *